United States Patent
Shi

(10) Patent No.: US 10,067,162 B2
(45) Date of Patent: *Sep. 4, 2018

(54) TESTING PROBE, SEMICONDUCTOR TESTING FIXTURE AND FABRICATION METHOD THEREOF

(71) Applicant: TONGFU MICROELECTRONICS CO., LTD., Nantong (CN)

(72) Inventor: Lei Shi, Nantong (CN)

(73) Assignee: TONGFU MICROELECTRONICS CO., LTD., Nantong (CN)

( * ) Notice: Subject to any disclaimer, the term of this patent is extended or adjusted under 35 U.S.C. 154(b) by 216 days.

This patent is subject to a terminal disclaimer.

(21) Appl. No.: 14/927,642

(22) Filed: Oct. 30, 2015

(65) Prior Publication Data
US 2016/0124018 A1 May 5, 2016

(30) Foreign Application Priority Data

Oct. 30, 2014 (CN) .......................... 2014 1 0606866
Oct. 30, 2014 (CN) .......................... 2014 1 0606939

(51) Int. Cl.
G01R 1/067 (2006.01)
G01R 3/00 (2006.01)

(52) U.S. Cl.
CPC ........... G01R 1/06733 (2013.01); G01R 3/00 (2013.01)

(58) Field of Classification Search
CPC ........... G01R 1/06733; G01R 1/07342; G01R 1/07307; G01R 1/06761; G01R 1/06738; G01R 1/067; G01R 31/28; G01R 31/2886; G01R 31/2831; G01R 31/308; G01R 19/0046

See application file for complete search history.

(56) References Cited

U.S. PATENT DOCUMENTS

| 5,274,336 | A | * | 12/1993 | Crook | G01R 1/07 324/149 |
|---|---|---|---|---|---|
| 6,370,426 | B1 | * | 4/2002 | Campbell | A61B 5/0531 324/696 |
| 6,404,213 | B2 | * | 6/2002 | Noda | G01R 1/06738 324/72.5 |
| 2002/0113609 | A1 | * | 8/2002 | Noda | G01R 1/06738 324/755.01 |
| 2005/0162177 | A1 | * | 7/2005 | Chou | G01R 1/06733 324/754.03 |
| 2010/0219806 | A1 | * | 9/2010 | Uchida | G01R 1/07 324/72 |
| 2011/0024911 | A1 | * | 2/2011 | Shibuya | G01R 27/14 257/773 |
| 2012/0323513 | A1 | * | 12/2012 | Prance | G06K 9/0002 702/65 |

FOREIGN PATENT DOCUMENTS

CN 101713790 A 5/2010
JP 5470142 B2 4/2014

* cited by examiner

*Primary Examiner* — Thang Le
(74) *Attorney, Agent, or Firm* — Anova Law Group, PLLC

(57) ABSTRACT

A testing probe is provided. The testing probe includes a first testing tip; an insulation layer formed on a side surface of the first testing tip; and a second testing tip being coaxial with the first testing tip and surrounding the first testing tip formed on a side surface of the insulation layer.

8 Claims, 5 Drawing Sheets

TESTING PROBE, SEMICONDUCTOR TESTING FIXTURE AND FABRICATION METHOD THEREOF

CROSS-REFERENCES TO RELATED APPLICATIONS

This application claims the priority of Chinese patent application No. 201410606866.7, filed on Oct. 30, 2014, and Chinese patent application No. 201410606939.2, filed on Oct. 30, 2014, the entirety of both of which are incorporated herein by reference.

FIELD OF THE INVENTION

The present invention generally relates to the field of semiconductor testing technology and, more particularly, relates to testing probes, semiconductor testing fixtures and fabrication processes thereof.

BACKGROUND

A semiconductor testing process is used to test the electrical characteristics and functionalities of packaged IC products after IC packaging processes so as to ensure the functional completeness of the IC products. Further, the testing process also includes categorizing the tested IC products according to their electrical performance. The testing results are used as the evaluation basis for grading the IC products. Finally, the testing process also includes checking the appearance of the IC products. An electrical testing, one aspect of the semiconductor testing process, is mainly focused on a variety of electrical parameters of the IC products to ensure that the IC products are able to function properly.

The conventional two-point testing method, such as Kelvin testing, etc., often utilizes double parallel top-probes or double parallel gold-fingers. The top-probes and the gold-fingers have a few limitations.

First, the manufacturing accuracy is relatively low. With the continuous shrinking of the critical dimension of semiconductor devices, the size of the tested terminals and/or the distance between different tested terminals are also continuously shrunk. To match such size and distance shrinkage, the limitations of the distribution of the conventional double top-probes and the double gold-fingers become more prominent. Thus, the accuracy requirements has become more and more strict. Sometimes, it is even unable to use the distribution with double top-probes or double gold-fingers.

Second, the structural strength is relatively low. To achieve a two-point testing in the limited space on the tested terminal, the top-probes and the gold-fingers have to be thinner and thinner. Thus, the mechanical strength of the top-probes and the gold fingers is correspondingly lower and lower.

Third, the life span is relatively short. The conventional top-probes and gold-fingers are easily worn. Especially, when the accuracy requirements are relatively high and the mechanical strength is relatively low, the wear may be more severe; and the life span of the testing fixture is reduced.

Fourth, the testing accuracy is relatively low. To adapt to the requirements of the miniaturization of semiconductor devices, the resistance of the top-probes and gold-fingers with the smaller and smaller size is continuously increased. When the top-probes or gold-fingers are used to test a relatively large current, a relatively large voltage drop is generated. The relatively large voltage drop would affect the testing results. Further, it is easy for the parallel distributed top-probes or gold-fingers to generate a distance difference, which may also affect the testing results. Further, to reduce the distance between two probes, the conventional double top-probes are usually distributed by inclining faces back-to-back. It is easy for the probes to spin out from the tested terminal because of the torque force of the spring in testing apparatus. Thus, the testing accuracy is affected. The disclosed device structures and methods are directed to solve one or more problems set forth above and other problems.

BRIEF SUMMARY OF THE DISCLOSURE

One aspect of the present disclosure includes a testing probe. The testing probe includes a first testing tip; an insulation layer formed on a side surface of the first testing tip; and a second testing tip being coaxial with the first testing tip and surrounding the first testing tip formed on a side surface of the insulation layer.

Another aspect of the present disclosure includes a semiconductor testing fixture. The semiconductor testing fixture comprises at least one disclosed testing probe on a substrate.

Another aspect of the present disclosure includes a method for forming a semiconductor testing fixture having a plurality of testing probes. The method includes providing a substrate; and forming a plurality of first testing tips on a surface of the substrate. The method also includes forming an insulation layer on side surfaces of the plurality of first testing tips; and forming a plurality of second testing tips being coaxial with the first testing tips and surrounding the first testing tips on side surfaces of the insulation layer. Wherein one first testing tip, one corresponding insulation layer around the first testing tip and one corresponding second testing tip around the insulation layer forms a testing probe.

Another aspect of the present disclosure includes a method for forming a semiconductor testing fixture having a plurality of testing probes. The method includes providing a substrate; and forming a dielectric layer on a surface of the substrate. The method also includes forming a plurality of first through-holes and a plurality of ring-shaped through-holes being coaxial with the first through-holes and surrounding the first through-holes in the dielectric layer; forming a first testing tip in each of the plurality of first through-holes and a second testing tip being coaxial with the first testing tip and surrounding the first testing tip in each of the ring-shaped through-holes; and removing portions of the dielectric layer outside of the second testing tips.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
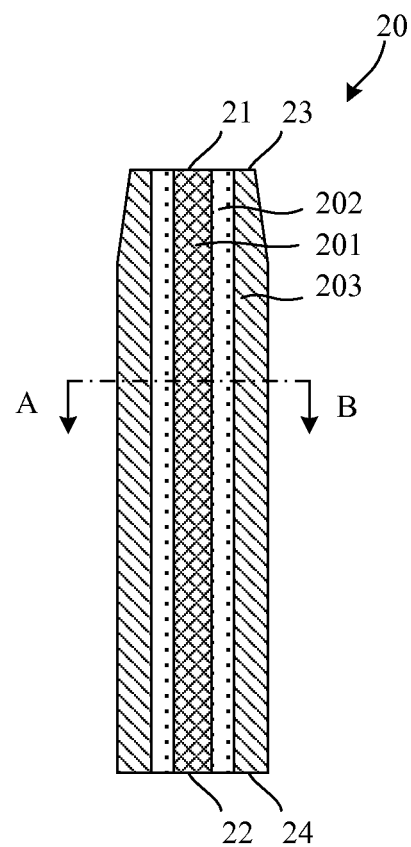
FIGS. 1~2 illustrate an exemplary testing probe consistent with the disclosed embodiments.
Figure 2:
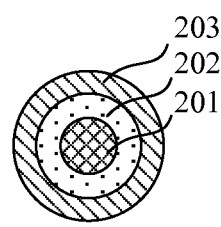

FIGS. 1~2 illustrate an exemplary testing probe consistent with the disclosed embodiments. FIG. 2 is a cross-sectional view of the structure illustrated in FIG. 1 along the AB direction.

As shown in FIGS. 1~2, the testing probe 20 may include a first testing tip 201. The first testing tip 201 may include a first tip body (not labeled), one end of the first tip body may be configured as a first testing head 21; and the other end of the first tip body may be configured as a first connecting end 22. Further, the testing probe 20 may also include an insulation layer 202 formed on the side surface of the first tip body.

Further, the testing probe 20 may also include a second testing tip 203 formed on the side surface of the insulation layer 202 and may surround the first testing tip 201. The second testing tip 203 and the first testing tip 201 may be coaxial. The second testing tip 203 may include a second tip body (not labeled), one end of the second tip body may be configured a second testing head 23, and the other end of the second tip body may be configured as a second connecting end 24. The surface of the second testing head 23 may level with the surface of the first testing head 21. The surface of the second testing head 23 and the surface of the first testing head 21 may contact with the surface of the tested terminal during a testing process.

Further, as shown in FIGS. 1~2, in one embodiment, the first testing tip 201 is a cylinder. Correspondingly, the cross-sectional view of the first testing tip 201 is a circle. The cross-sectional view of the insulation layer 202 is a circular ring. The cross-sectional view of the second testing tip 203 is also a circular ring. In certain other embodiments, the cross-sectional view of the first testing tip 201 may be any other appropriate shape, such as a triangle, or square, etc.

In one embodiment, the testing probe 20 may be formed by a microfabrication process. Thus, the diameter of the first testing tip 201 may be substantially small. In one embodiment, the diameter of the first testing tip 201 may be in a range of approximately 100 nm~500 μm. For example, the diameter of the first testing tip 201 is in a range of approximately 200 nm~50 μm.

Correspondingly, the width of the insulation layer 202 and the width of the second testing tip 203 may also be substantially small. In one embodiment, the width of the insulation layer 202 may be in a range of approximately 80 nm~400 μm. For example, the width of the second testing tip 203 is in a range of approximately 100 nm~10 μm. The width of the second testing tip 203 may be in a range of approximately 60 nm~300 μm. For example, the width of the second testing tip 203 is in a range of approximately 90 nm~25 μm. In certain other embodiments, the diameter of the first testing tip 201, the width of the insulation layer 202 and the width of the second testing tip 203 may be any other appropriate value.

The first testing tip 201 and the second testing tip 203 may be made of any appropriate material, such as Cu, Au, W, or alloy material, etc. The first testing tip 201 and the second testing tip may be made of a same material, or different materials.

The insulation layer 202 may be used to electrically insulate the first testing tip 201 and the second testing tip 203. As shown in FIG. 1, one end surface of insulation layer 202 may level with the first testing head 21 of the first testing tip 201 and the second testing head 23 of the second testing tip 203. The other end surface of the insulation layer 202 may level with the first connecting end 22 of the first testing tip 201 and the second connecting end 24 of the second testing tip 203.

Further, there may be no gap between the first testing head 21 of the first testing tip 201 and the second testing head 23 of the second testing tip 203. Such a structure may prevent the first testing head 21 of the first testing tip 201 and the second testing head 23 of the second testing tip 203 from deforming during a testing process. If there is a gap between the first testing head 21 of the first testing tip 201 and the second testing head 23 of the second testing tip 203, the first testing head 21 of the first testing tip 201 and the second testing head 23 of the second testing tip 203 may be deformed by external forces during the testing process. The deformation may cause the first testing head 21 of the first testing tip 201 and the second testing head 23 of the second testing tip 203 to be electrically connected. Accordingly, the testing accuracy may be affected.

The insulation layer 202 may be a single layer structure, or a multiple-stacked structure. The insulation layer 202 may be made of an insulation material, such as one or more of silicon oxide, silicon nitride, silicon oxynitride, and silicon carbonitride, etc. The insulation layer 202 may also be made of resin material, such as epoxy, polyimide, polyethylene, benzocyclobutene, or polybenzoxazole, etc.

Further, as shown in FIG. 1, the end of the testing probe 20 having the first testing head 21 and the second testing head 23 may be tapered. That is, along a direction from the second connecting end 24 to the second testing head 23, the width of the portion of the second tip body near the second testing head 23 of the second testing tip 203 may be continuously reduced. Such a shape may increase the distance between adjacent testing probes 20 when a plurality of testing probes 20 are used to perform a test.

Thus, as shown in FIGS. 1~2, the first testing tip 201 and the second testing tip 203 may be integrated in a testing probe 20; the second testing tip 203 may surround the first testing tip 201; and the insulation layer 202 may electrically insulate the first testing tip 201 and the second testing tip 203. Thus, the mechanical strength of the testing probe 20 may be improved when the size of the testing probe 20 is substantially small.

Further, the first testing tip 201 and the second testing tip 203 may be coaxially distributed. Thus, the distance accuracy between the first testing tip 201 and the second testing tip 203 may be relatively high. The distance between the first testing tip 201 and the second testing tip 203 may be kept as a constant during a testing process. Thus, the testing accuracy may be improved.

Further, comparing with the dual top-probes or dual gold-fingers, because the first testing tip 201 and the second testing tip 203 may be integrated in a testing probe 20, it may only need one testing probe 20 to perform an electrical testing.

In one embodiment, the testing probe 20 may be used to test a resistance or a relatively large current. One end of the testing probe 20 may contact with a tested terminal. That is, the first testing head 21 of the first testing tip 201 and the second testing head 23 of the second testing tip 203 may contact with the surface of the tested terminal. Then, a testing voltage may be applied between the first testing tip 201 and the second testing tip 203; and the current passing through the first testing tip 201, the second testing tip 203 and the tested terminal may be measured. According to the applied voltage and the measured current, the resistance may be obtained.

When the testing probe 20 is used to perform a resistance testing, because the first testing tip 201 and the second testing tip 203 may be coaxial, the current passing through the first testing tip 201 may be distributed radially; and flow to the second testing tip 201. That is, the current flowing through the circular region (the region contacts with the end surface of the insulation layer 202) of the tested terminal may be uniform. Thus, the testing accuracy may be improved.

In certain other embodiments, the testing probe 20 may be used to perform other types of electrical testing. For example, a plurality of testing probes 20 may be used to perform an electrical testing. The testing current may flow from the first testing tip 201 or the second testing tip 203 of one testing probe 20 to the first testing tip 201 or the second testing tip 203 of anther testing probe 20. Or, the testing current may flow from the first testing tip 201 and the second testing tip 203 of one testing probe 20 to the first testing tip 201 and the second testing tip 203 of another testing probe 20.

Figure 3:
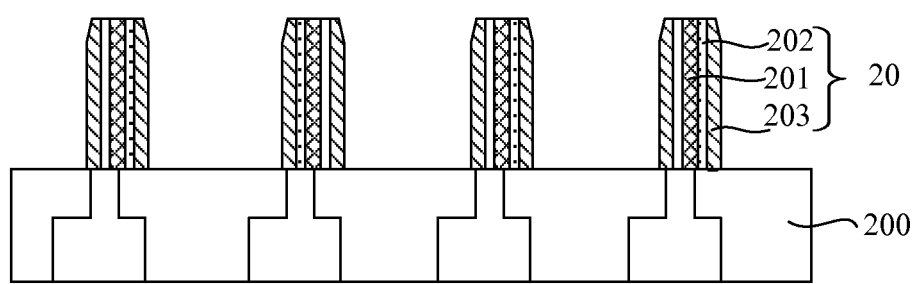
FIG. 3 illustrates an exemplary semiconductor testing fixture having a plurality of testing probes consistent with the disclosed embodiments.

FIG. 3 illustrates an exemplary semiconductor testing fixture consistent with the disclosed embodiments. The testing fixture includes a substrate 200, and a plurality of testing probes 20 formed on the substrate 200. The testing probes 20 may be the disclosed testing probes. The number of the testing probes 20 may be greater than one. In one embodiment, the testing probes 20 may be distributed on the substrate as a row.

A signal transmitting circuit may be formed in the substrate 200. The signal transmitting circuit may include first input terminals (not labeled), second input terminals (not labeled), first output terminals (not labeled) and second output terminals (not labeled), etc. For each testing probe 20, the first output terminal may be electrically connected with the first connecting end (not labeled) of the first testing tip 201; and the second output terminal may be electrically connected with the second connecting end (not labeled) of the second testing tip 203.

The first input terminals and the second input terminals may be electrically connected with the external testing circuitry. The external testing circuitry may be used to provide testing signals. The signal transmitting circuit may be used to transmit the testing signals provided by the external testing circuit to the first testing tips 201 and the second testing tips 203; and transmit the electrical signals obtained from the testing process back to the external testing circuit. The external testing circuit may process the received electrical signals; and the testing parameters may be obtained.

The substrate 200 may be made of the any appropriate material. In one embodiment, the substrate 200 is made of PCB resin.

Further, first metal lines (not labeled) and second metal lines (not labeled) may be formed in the substrate 200. The first input terminals and the first output terminals may be electrically connected through the first metal lines. The second input terminals and the second output terminals may be electrically connected through the second metal lines.

In one embodiment, the substrate 200 may have a front surface and a facing back surface. The back surface of the substrate 200 may include interface regions. The plurality of first output terminals and the plurality of second output terminals may be disposed on the front surface of the substrate 200; and may be corresponding to the positions of the first testing tips 201 and the second testing tips 203. The plurality of first input terminals and the plurality of second input terminals may be integrated in the interface regions on the back surface of the substrate 200. Thus, the plurality of first input terminals and the plurality of second input terminals may be connected with the external testing circuitry through one or more interfaces; and the interface circuit between the testing fixture and the external testing circuit may be simplified.

In one embodiment, the substrate 200 may be formed by compressing a plurality of PCB boards. Each PCB boards may include a plurality of interconnect structures. Each interconnect structure may include a plurality of through-board structures and metal layers formed on the surface of the PCB board and electrically connecting with through-board structures. When the plurality of PCB boards are compressed to form the substrate 200, the plurality of interconnect structures may form the first metal lines and the second metal lines. Thus, the plurality of first input terminals and the plurality of second input terminals may be integrated in the interface regions on the back face of the substrate 200.

In certain other embodiments, the substrate 200 may have a front surface and a facing back surface. The back surface of the substrate 200 may include interface regions. The plurality of first output terminals and the plurality of second output terminals may be disposed on the front surface of the substrate 200. A plurality of first through-board interconnect structures and a plurality of second through-board interconnect structures penetrating through the substrate 200 may be formed in the substrate 200. The first input terminals and the first output terminals may be electrically connected through the first through-board interconnect structures; and the second input terminals and the second output terminals may be electrically connected through the second through-board interconnect structures.

Further, a plurality of first redistribution metal layers and a plurality of second redistribution layers may be formed on the back surface of the substrate 200. One end of the first redistribution metal layer may be electrically connected with the first input terminal; and the other end of the first redistribution metal layer may be disposed in the interface region. One end of the second redistribution metal layer may be electrically connected with the second terminal; and the other end of the second redistribution metal layer may be disposed in the interface region. The first redistribution metal layers and the second redistribution layers may be electrically connected with the external testing circuitry through one or more interfaces.

In certain other embodiments, a testing circuit (not shown) may be formed in the substrate 200. The testing circuit may include a first signal terminal and a second signal terminal. The first signal terminal may be electrically connected with the first connecting end of the first testing tip 201. The second signal terminal may be electrically connected with the second connecting end of the second testing tip 201. When the semiconductor testing fixture is used to perform a test, testing signals, such as voltage signals or current signals, etc., may be applied onto the first testing tip 201 and the second testing tip 203; and received signals, such as current signals, etc., may be processed to obtain the testing parameters, such as a resistance, etc.

In one embodiment, the substrate 200 may include a semiconductor substrate and a dielectric layer formed on the semiconductor substrate. The semiconductor substrate may be a silicon substrate, or a germanium substrate, etc. Semiconductor devices, such as transistors, etc., may be formed on the semiconductor substrate; and metal interconnect lines and passive devices, such as resistors and capacitors, etc., may be formed in the dielectric layer. The metal interconnect lines may electrically connect the semiconductor devices and the passive devices to form the testing circuit. The first signal terminal and the second signal terminal may be led out by the first metal lines and the second metal lines which are electrically connected with the testing circuit in the dielectric layer.

Figure 4:
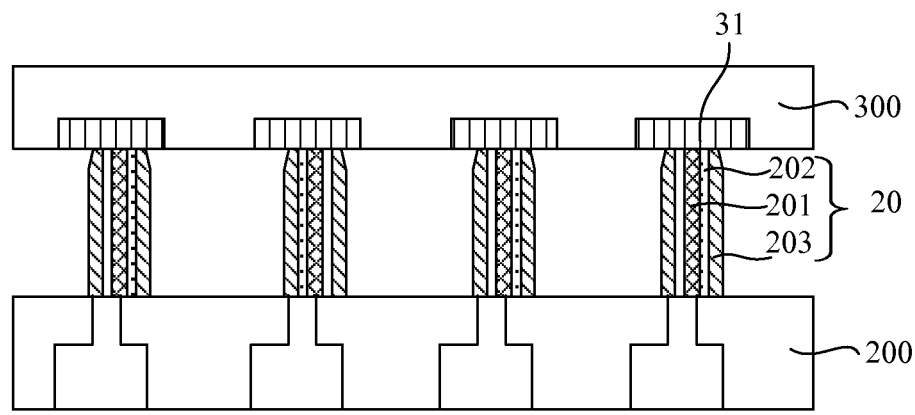
FIG. 4 illustrates an exemplary semiconductor testing fixture having a plurality of testing probes used in a testing process consistent with the disclosed embodiment.

FIG. 4 illustrates a structure corresponding to an electrical testing utilizing the semiconductor testing fixture illustrated in FIG. 3. As show in FIG. 4, at the beginning of the testing process, the semiconductor testing fixture is installed in a testing apparatus; and then the tested packaging structure 300 may be disposed on the semiconductor testing fixture. The tested packaging structure 300 may include a plurality of tested terminals 31. The tested terminals 31 may be contacting pads, or soldering pads, etc. Portions of the surfaces of the tested terminals 31 may be electrically connected with the test heads of the testing probes 20, including the first testing heads of the first testing tips 201, and the second testing heads of the second testing tips 203. Then, testing signals may be applied between the first testing tips 201 and the second testing tips 203 to perform the electrical testing.

The semiconductor testing fixture may be able to perform an electrical testing on a plurality of tested terminals simultaneously. Thus, the testing efficiency and the testing accuracy may be improved. Further, the semiconductor testing fixture may be applied to a manual testing, i.e., manually install the tested packaging structure; or an automatic testing, i.e., install the tested packaging structure by robots.

Figure 14:
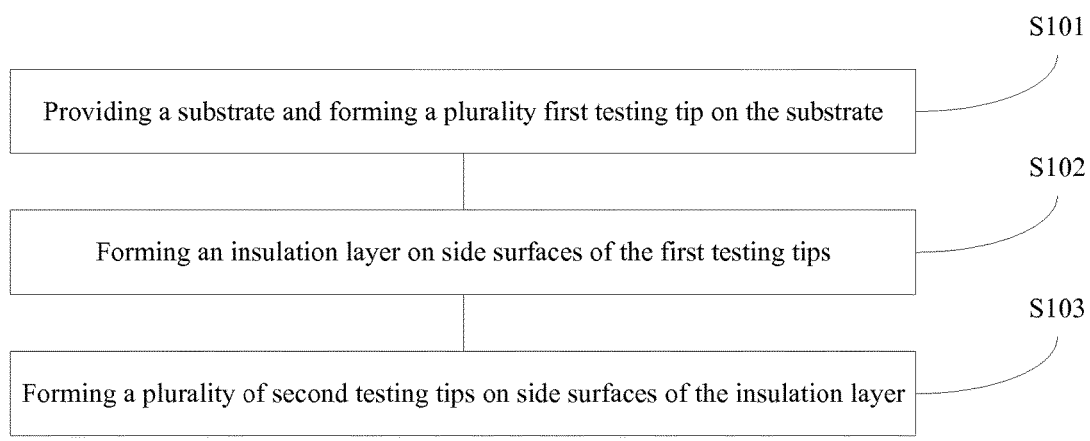
FIG. 14 illustrates an exemplary fabrication process of a semiconductor testing fixture having at least one testing probe consistent with the disclosed embodiments.

FIG. 14 illustrates an exemplary fabrication process of a semiconductor testing fixture having at least one testing probe consistent with the disclosed embodiment. FIGS. 5~9 illustrate structures corresponding certain stages of the exemplary fabrication process.

Figure 5:
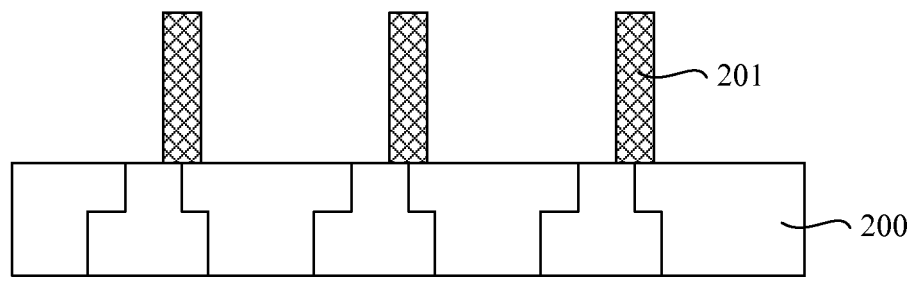
FIGS. 5~9 illustrate structures corresponding to certain stages of an exemplary fabrication process of a semiconductor testing fixture having at least one testing probe consistent with the disclosed embodiments.

As show in FIG. 14, at the beginning of the fabrication process, a substrate with certain structures is provided (S101). FIG. 5 illustrates a corresponding structure.

As shown in FIG. 5, a substrate 200 in provided. Further, a plurality of first testing tips 201 may be formed on the substrate 200. One end of the first testing tip 201 connecting with the surface of the substrate 200 may be referred as a first connecting end; and the other end (the end facing the first connecting end) of the first testing tip 201 may be referred as a first testing head.

In embodiment, a signal-transmitting circuit may be formed in the substrate 200. The signal-transmitting circuit may include first input terminals (not labeled), second input terminals (not labeled), first output terminals (not labeled) and second output terminals (not labeled), etc. The first output terminal may be electrically connected with the first connecting end (not labeled) of the first testing tip 201; and the second output terminal may be electrically connected with the second connecting end (not labeled) of the subsequently formed second testing tip.

The first input terminals and the second input terminals may be electrically connected with the external testing circuit. The external testing circuit may be used to provide testing signals. The signal-transmitting circuit may be used to transmit the testing signals provided by the external testing circuit to the first testing tip 201 and the subsequently formed second testing tip; and transmit the electrical signals obtained from the testing process back to the external testing circuit. The external testing circuit may process the received electrical signals; and the testing parameters may be obtained.

Further, first metal lines (not labeled) and second metal lines (not labeled) may be formed in the substrate 200. The first input terminals and the first output terminals may be electrically connected through the first metal lines formed in the substrate 200. The second input terminals and the second output terminals may be electrically connected through the second metal lines formed in the substrate 200.

In one embodiment, the substrate 200 may have a front surface and a facing back surface. The back surface of the substrate 200 may have interface regions. The plurality of first output terminals and the plurality of second output terminals may be disposed on the front surface of the substrate 200; and may be corresponding to the positions of the first testing tips 201 and the subsequently formed second testing tips. The plurality of first input terminals and the plurality of second input terminals may be integrated in the interface regions on the back surface of the substrate 200. Thus, the plurality of first input terminals and the plurality of second input terminals may be connected with the external testing circuit through one or more interfaces; and the interface circuit between the semiconductor testing fixture and the external testing circuit may be simplified.

In one embodiment, the substrate 200 may be formed by compressing a plurality of PCB boards. Each PCB boards may include a plurality of interconnect structures. Each interconnect structure may include a plurality of through-board structures and metal layers formed on the surface of the PCB board and electrically connecting with through-board structures. When the plurality of PCB boards are compressed, the plurality of interconnect structure may form the first metal lines and the second metal lines. Thus, the plurality of first input terminals and the plurality of second input terminals may be integrated in the interface regions on the back face of the substrate 200.

In certain other embodiments, the substrate 200 may have a front surface and a facing back surface. The back surface of the substrate 200 may include interface regions. The plurality of first output terminals and the plurality of second output terminals may be disposed on the front surface of the substrate 200. A plurality of first through-board interconnect structures and a plurality of second through-board interconnect structure penetrating through the substrate 200 may be formed in the substrate 200. The first input terminals and the first output terminals may be electrically connected through the first through-board interconnect structures; and the second input terminals and the second output terminals may be electrically connected through the second through-board interconnect structures.

Further, a plurality of first redistribution metal layers and a plurality of second redistribution layers may be formed on the back surface of the substrate 200. One end of the first redistribution metal layer may be electrically connected with the first input terminal; and the other end of the first redistribution metal layer may be disposed in the interface region. One end of the second redistribution metal layer may be electrically connected with the second terminal; and the other end of the second redistribution metal layer may be disposed in the interface region. The first redistribution metal layers and the second redistribution layers may be electrically connected with the external testing circuitry through one or more interfaces.

In certain other embodiments, a testing circuit (not shown) may be formed in the substrate 200. The testing circuit may include a first signal terminal and a second signal terminal. The first signal terminal may be electrically connected with the first connecting end of the first testing tip 201. The second signal terminal may be electrically connected with the second connecting end of the subsequently formed second testing tip. When the testing circuit is used to perform a test, testing signals, such as voltage signals or current signals, etc., may be applied onto the first testing tip 201 and the subsequent formed second testing tip; and received signals, such as current signals, etc., may be processed to obtain the testing parameters, such as resistance, etc.

In one embodiment, the first testing tip 201 is a cylinder. Correspondingly, the cross-sectional view of the first testing tip 201 along a direction parallel to the surface of the substrate 200 is a circle. In certain other embodiments, the cross-sectional view of the first testing tip 201 may be any other appropriate shape, such as a triangle, or square, etc.

The diameter of the first testing tip may be in a range of approximately 100 nm~500 μm. The number of the plurality of first tips may be equal to, or greater than two. In one embodiment, for illustrative purposes, three first testing tips 201 are formed on the substrate 200.

In one embodiment, a process for forming the first testing tip 201 may include forming a sacrificial layer (not shown) having a plurality of through-holes exposing the surface of the substrate 200 on the substrate 200; filling the through-holes with a first metal layer to form the plurality of the first testing tips 201; and removing the sacrificial layer. Thus, the plurality of first testing tips 201 may be formed.

The first metal layer may be formed by any appropriate process, such as a chemical vapor deposition (CVD) process, a physical vapor deposition (PVD) process, a flowable CVD (FCVD) process, or an electroplating process. In one embodiment, the first metal layer is formed by an electroplating process. Before the electroplating process, a conductive layer may be formed on the side and bottom surfaces of the through-holes. The conductive layer may be used as a cathode for the electroplating process.

The conductive layer may be a single layer structure, or a multiple-layer structure. The conductive layer may be made of one or more of Ti, Ta, TiN, and TaN, etc.

In one embodiment, the conductive layer is a double-layer structure. The double-layer structure may be a structure having a Ti layer and a TiN layer formed on the Ti layer, or a structure having a Ta layer and a TaN layer formed on the Ta layer.

The thickness of the conductive layer may be smaller than the diameter of the through-holes. In one embodiment, the thickness of the conductive layer may be in a range of approximately 50 nm~200 nm.

Various processes may be used to form the conductive layer. In one embodiment, the conductive layer is formed by a sputtering process.

After forming the conductive layer, an electroplating process may be performed to form the first metal layer. The first metal layer may be formed on the conductive layer; and may fill the through-holes. After the electroplating process, a chemical mechanical polishing (CMP) process may be performed to remove portions of the first metal layer and the conductive layer on the surface of the sacrificial layer. Thus, the first testing tips 201 may be formed. Therefore, the first testing tips 201 may include a portion of the first metal layer and a portion of the conductive layer covering the portion of the first metal layer. The portion of the conductive layer may be used as a diffusion barrier layer to prevent the metal of the first metal layer from diffusing into the subsequently formed insulation layer. The first metal layer may be made of any appropriate material, such as Cu, Au, W, or metal alloy, etc.

In certain other embodiments, a process for forming the plurality of the first testing tips 201 may include forming a first metal layer (not shown) on the substrate 200; forming a patterned mask layer (not shown) on the first metal layer; etching the first metal layer using the patterned mask layer as an etching mask to form the plurality of first testing tips 201; and removing the patterned mask layer. Thus, the plurality of first testing tips 201 may be formed on the substrate 200.

Figure 6:
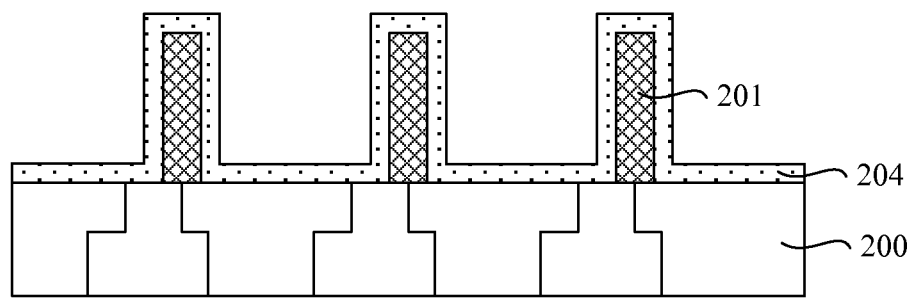
Figure 7:
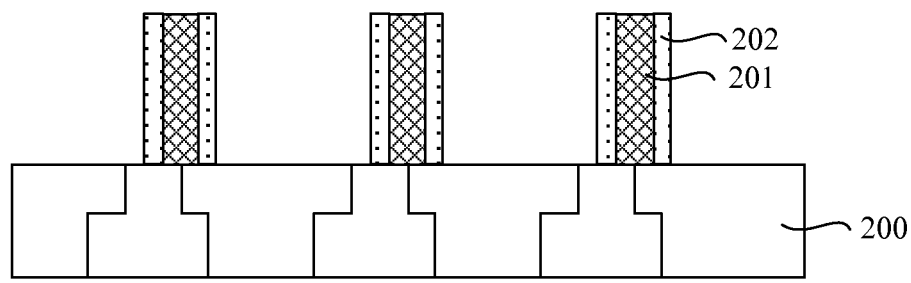

Returning to FIG. 14, after forming the plurality of first testing tips 201, an insulation layer may be formed (S102). FIGS. 6~7 illustrate corresponding structures.

As shown in FIG. 7, an insulation layer 202 is formed on the side surface of each of the plurality of first testing tips 201. The insulation layer 202 may be a single layer structure or a multiple-layer structure. The insulation layer 202 may be made of any appropriate material, such as one or more of silicon oxide, silico nitride, silicon oxynitride, and silicon carbonitride, etc. The thickness of the insulation layer 207 may be in a range of approximately 80 nm~400 μm.

A process for forming the insulation layer 202 may include forming an insulation film 204 on the side surfaces of the first testing tips 201 and the surface of the substrate 200 (as shown in FIG. 6). That is, the insulation film 204 may cover the first testing tips 201. The process may also include performing a mask-less etching process (etch-back) process on the insulation film 204. Thus, the insulation layer 202 may be formed on the side surface of each first testing tips 201 (as shown in FIG. 7).

In one embodiment, the insulation layer 202 is made of silicon oxide. The insulation film 204 may be formed by any appropriate process, such as a CVD process, a PVD process, or an FCVD process, etc.

In certain other embodiments, the insulation layer 202 may be made of resin material. The resin material may include epoxy, polyimide, polyethylene, benzocyclobutene, or polybenzoxazole, etc. The insulation film 204 may be formed by a screen-printing process, etc.

The mask-less etching process may be any appropriate process. In one embodiment, the mask-less etching process is an anisotropic plasma etching process. In one embodiment, the etching gas of the anisotropic plasma etching process may include fluoride and carbon-containing gas, etc. Specifically, the etching gas may include one or more $CF_4$, $C_2F_6$, $C_4F_8$, $CHF_3$, and $CH_2F_2$. The source power of the plasma may be in a range of approximately 500 W~1000 W. The bias power of the plasma may be in a range of 0~100 W. The pressure of the etching chamber may be in a range of approximately 2 mTorr~500 mTorr.

Figure 8:
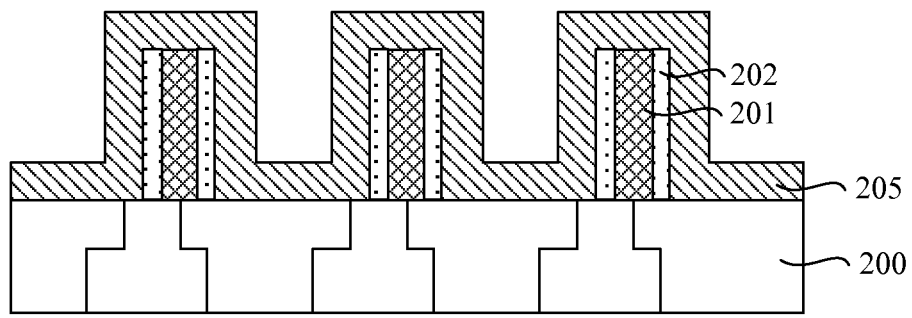
Figure 9:
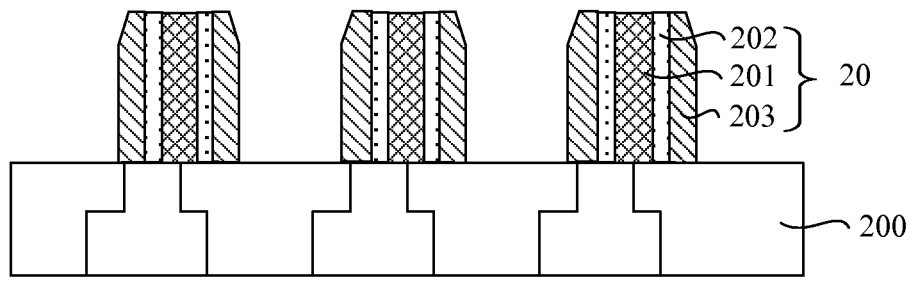

Returning to FIG. 14, after forming the insulation layer 202, a plurality of second testing tips may be formed (S103). FIGS. 8~9 illustrate corresponding structures.

As shown in FIG. 9, a second testing tip 203 is formed on the insulation layer 202 around each of the first testing tips 201. The second testing tip 203 may surround the first testing tip 201. Further, the second testing tip 203 may be coaxial with the first testing tip 201. One end of the second testing tip 203 connecting with the surface of the substrate 200 may be referred as a second connecting end; and the other end (facing the second connecting end) of the second testing tip 203 may be referred as a second testing head. The second testing head of the second testing tip 203 may be level with the first testing head of the first testing tip 201.

A process for forming the second testing tips 203 may include forming a second metal layer 205 covering the top surfaces of the insulation layer 202 and the first testing tips 201, the side surface of the insulation layer 202 and the surface of the substrate 200 (as shown in FIG. 8); and performing a mask-less etching process to remove portions of the second metal layer 205 on the top surfaces of the insulation layer 202 and the first testing tips 201 and the surface of the substrate 200. Thus, as shown in FIG. 9, the second testing tips 203 may be formed.

Each of the first testing tips 201 and the corresponding insulation layer 202 and the corresponding second testing tip 203 may form a testing probe 20. Thus, a plurality of testing probes 20 may be formed on the substrate 200. That is, the testing fixture may include the substrate 200 and the plurality of testing probes 20. Further, such a process for forming the testing fixture may also be used form one or more testing probes 20, either stand alone, or with a same substrate.

The second metal layer 205 may be made of any appropriate material, such as Cu, Au, W, or metal alloy, etc. The thickness of the second metal layer 205 may be in a range of approximately 60 nm~300 μm.

Various processes may be used to form the second metal layer 205, such as a CVD process, a PVD process, an FCVD process, an electroplating process, or a sputtering process, etc. In one embodiment, the second metal layer 205 is formed by a sputtering process.

The mask-less etching process may be any appropriate process. In one embodiment, the mask-less etching process is an anisotropic plasma etching process. The etching gas of the plasma etching process may include one or more of $SF_6$, $NF_3$, $Cl_2$, and HBr, etc. The source power of the plasma may be in a range of approximately 500 W~1500 W. The bias power of the plasma may be in a range of approximately 0~100 W. The pressure of the etching chamber may be in a range of approximately 10 mTorr~500 mTorr.

Figure 15:
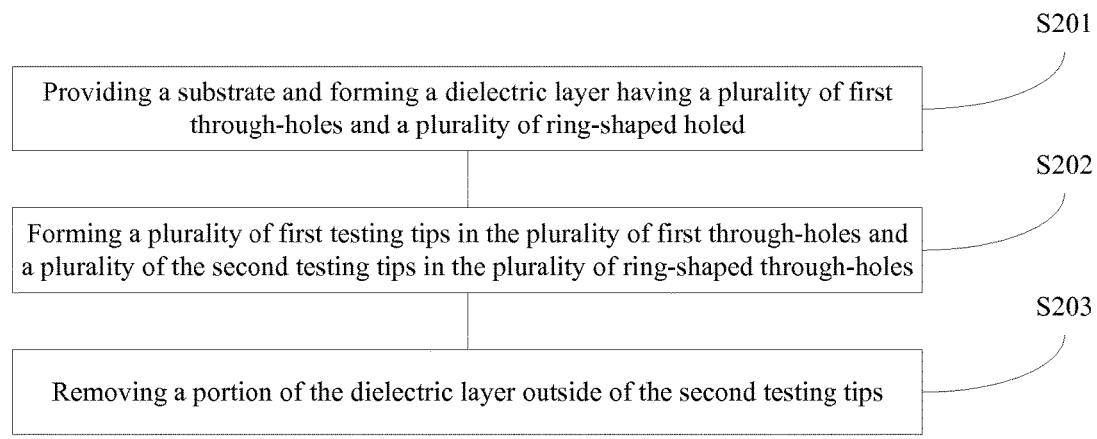
FIG. 15 illustrates another exemplary fabrication process of a semiconductor testing fixture having at least one testing probe consistent with the disclosed embodiments.

FIG. 15 illustrates another exemplary fabrication process of a testing fixture having a plurality of testing probes consistent with the disclosed embodiment. FIGS. 10~13 illustrates structures corresponding certain stages of the exemplary fabrication process.

Figure 10:
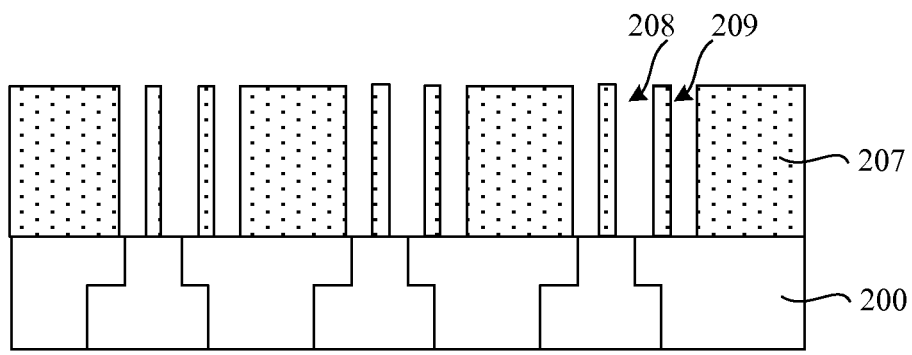
FIGS. 10~13 illustrate structures corresponding to certain stages of another exemplary fabrication process of a semiconductor testing fixture having at least one testing probe consistent with the disclosed embodiments.
Figure 11:
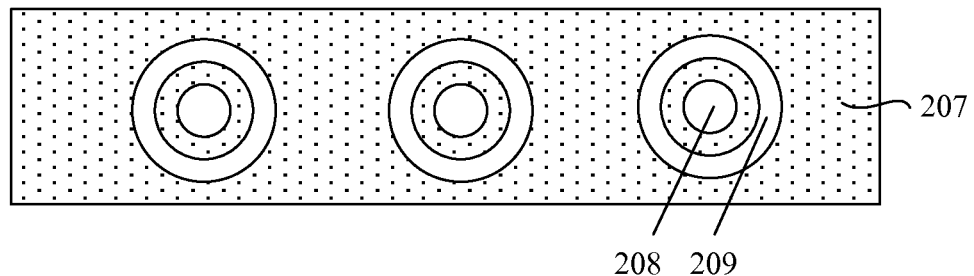

As shown in FIG. 15, at the beginning of the fabrication process, a substrate with certain structures is provided (201). FIGS. 10~11 illustrates a corresponding structure. FIG. 11 is a top-view of the structure illustrated in FIG. 10.

As shown in FIGS. 10~11, a substrate 200 is provided. Further, a dielectric layer 207 is formed on the substrate 200. The dielectric layer 207 may have a plurality of first through-holes 208, and a plurality of ring-shaped through holes 209 surrounding the first through-holes 208. The first through-hole 208 may be insulated from the ring-shaped through-holes 209 by portions of the dielectric layer 207. Further, each of the first though-holes 208 may be coaxial with a surrounding ring-shaped through-hole 209.

The top view of the first through-holes 208 may be circular; and the top view of the ring-shaped through holes 209 may be ring-shaped. In certain other embodiments, the top view of the first through-holes 208 may be any other appropriate shape, such as triangle, rectangle, or square, etc.

The first through-holes 208 may expose the surface of the substrate 200 and may be used for subsequently forming first testing tips. The ring-shaped through-holes 209 may expose the surface of the substrate 200; and may be used for subsequently forming second testing tips. The subsequently formed first testing tips, the subsequently formed second testing tip and the portions of the dielectric layer 207 insulating the first through-holes 208 and the ring-shaped through-holes 209 may form a plurality of testing probes on the substrate 200. One end of the subsequently formed first testing tip connecting with the surface of the substrate 200 may be referred as a first connecting end; and the other end of the subsequently formed first testing tip may be referred a first testing head. One end of the subsequently formed second testing tip connecting with the surface of the substrate 200 may be referred as a second connecting end; and the other end of the subsequently formed second testing tip may be referred a second testing head. The first testing head may level with the second testing head. The first testing head and the second testing head may contact with the surface of the tested terminal during a testing process.

In embodiment, a signal-transmitting circuit may be formed in the substrate 200. The signal-transmitting circuit may include first input terminals (not labeled), second input terminals (not labeled), first output terminals (not labeled) and second output terminals (not labeled), etc. The first output terminal may be electrically connected with the first connecting end of the subsequently formed first testing tip; and the second output terminal may be electrically connected with the second connecting end (not labeled) of the subsequently formed second testing tip. The first input terminals and the second input terminals may be electrically connected with the external testing circuit. The external testing circuit may be used to provide testing signals. The signal-transmitting circuit may be used to transmit the testing signals provided by the external testing circuit to the subsequently formed first testing tip and the subsequently formed second testing tip; and transmit the electrical signals obtained from the testing process back to the external testing circuit. The external testing circuit may process the received electrical signals; and the testing parameters may be obtained.

Further, first metal lines (not labeled) and second metal lines (not labeled) may be formed in the substrate 200. The first input terminals and the first output terminals may be electrically connected through the first metal lines formed in the substrate 200. The second input terminals and the second output terminals may be electrically connected through the second metal lines formed in the substrate 200.

In one embodiment, the substrate 200 may have a front surface and a facing back surface. The back surface of the substrate 200 may include interface regions. The plurality of first output terminals and the plurality of second output terminals may be disposed on the front surface of the substrate 200; and may be corresponding to the positions of the subsequently formed first testing tips and the subsequently formed second testing tips. The plurality of first input terminals and the plurality of second input terminals may be integrated in the interface regions on the back surface of the substrate 200. Thus, the plurality of first input terminals and the plurality of second input terminals may be connected with the external testing circuit through one or more interfaces; and the interface circuit between the semiconductor testing fixture and the external testing circuit may be simplified.

In one embodiment, the substrate 200 may be formed by compressing a plurality of PCB boards. Each PCB boards may include a plurality of interconnect structures. Each interconnect structure may include a plurality of through-board structures and metal layers formed on the surface of the PCB board, and electrically connecting with through-board structures. When the plurality of PCB boards are compressed to form the substrate 200, the plurality of interconnect structures may form the first metal lines and the second metal lines. Thus, the plurality of first input terminals and the plurality of second input terminals may be integrated in the interface regions on the back face of the substrate 200.

In certain other embodiments, the substrate 200 may have a front surface and a facing back surface. The back surface of the substrate 200 may include interface regions. The plurality of first output terminals and the plurality of second output terminals may be disposed on the front surface of the substrate 200. A plurality of first through-board interconnect structures and a plurality of second through-board interconnect structures penetrating through the substrate 200 may be formed in the substrate 200. The first input terminals and the first output terminals may be electrically connected through the first through-board interconnect structures; and the second input terminals and the second output terminals may be electrically connected through the second through-board interconnect structures.

Further, a plurality of first redistribution metal layers and a plurality of second redistribution layers may be formed on the back surface of the substrate 200. One end of the first redistribution metal layer may be electrically connected with the first input terminal; and the other end of the first redistribution metal layer may be disposed in the interface region. One end of the second redistribution metal layer may be electrically connected with the second terminal; and the other end of the second redistribution metal layer may be disposed in the interface region. The first redistribution metal layers and the second redistribution layers may be electrically connected with the external testing circuit through one or more interfaces.

In certain other embodiments, a testing circuit (not shown) may be formed in the substrate 200. The testing circuit may include a first signal terminal and a second signal terminal. The first signal terminal may be electrically connected with the first connecting end of the subsequently formed first testing tip. The second signal terminal may be electrically connected with the second connecting end of the subsequently formed second testing tip. When the testing circuit is used to perform a test, testing signals, such as voltage signals or current signals, etc., may be applied onto the subsequently formed first testing tip and the subsequent formed second testing tip; and received signals, such as current signals, etc., may be processed to obtain the testing parameters, such as resistance, etc.

The dielectric layer 207 may be made of any appropriate material, such as one or more of silicon oxide, silicon nitride, silicon oxynitride, and silicon carbonitride, etc. Various processes may be used to form the dielectric layer 207, such as a CVD process, a PVD process, or an FCVD process, etc. In one embodiment, the dielectric layer 207 is formed by a CVD process.

After forming a dielectric material layer by a CVD process, a patterned mask layer may be formed on the dielectric material layer. Then, the plurality of first through-holes 208 and the corresponding ring-shaped through-holes 209 may be formed by etching the dielectric material layer using the patterned mask layer as an etching mask to form the dielectric layer 207. After forming the dielectric layer 207 having the plurality of first through-holes 208 and the plurality of ring-shaped through-holes 209, the patterned mask layer may be removed.

The dielectric material layer may be etched by any appropriate process, such as a dry etching process, a wet etching process, or an ion beam etching process, etc. The patterned mask layer may be removed by any appropriate process, such as a dry etching process, a wet etching process, or a plasma ashing process, etc.

In certain other embodiments, the dielectric layer 207 may be made of resin material. The resin material may include epoxy, polyimide, polyethylene, benzocyclobutene, or polybenzoxazole, etc. The dielectric layer 207 made of resin may be formed by a dry-coating process, a wet-coating process, a screen-printing process, or a roll-coating process, etc.

After forming a dielectric film made of the resin, an exposure process and a developing process may be performed to form the plurality of first through-holes 208 and the corresponding ring-shaped through-holes 209. Accordingly, the dielectric layer 207 made of the resin may be formed. By using such a process, the fabrication process of the dielectric film 207 may be simplified.

Figure 12:
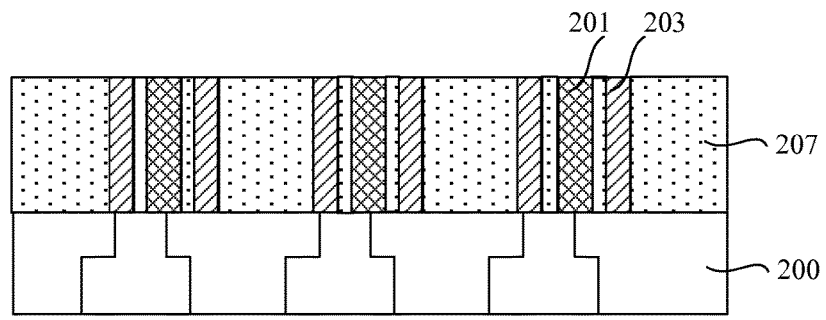

Returning to FIG. 15, after forming the dielectric layer 207, a plurality of first testing tips and a plurality of second tips may be formed (S202). FIG. 12 illustrates a corresponding structure.

As shown in FIG. 12, a first testing tip 201 is formed in each of the plurality of first through-holes 208; and a second testing tip 203 is formed in each of the plurality of ring-shaped through-holes 209. The first testing tips 201 and the second testing tips 203 may be formed by a same step. In certain other embodiments the first testing tips 201 and the second testing tips 202 may be formed by separated steps.

The first testing tips 201 and the second testing tips 203 may be formed by any appropriate process, such as a CVD process, a PVD process, an FCVD process, a sputtering process, or an electroplating process, etc. In one embodiment, the first testing tips 201 and the second testing tips 203 is formed by an electroplating process.

Before the first testing tips 201 and the second testing tips 203 are formed by an electroplating process, a conductive layer (not shown) may be formed on the side surfaces and bottoms of the first through-holes 208 and the ring-shaped through-holes 209 and the surface of the dielectric layer 207. The conductive layer may be used as a cathode for the electroplating process.

The conductive layer may be a single layer structure, or a multiple-layer structure. The conductive layer may be made of any appropriate material, such as one or more of Ti, Ta, TiN, and TiN, etc. In one embodiment, the conducive layer is a double-layer structure. The double-layer structure may be a structure having a Ti layer and a TiN layer formed on the Ti layer, or a structure having a Ta layer and a TaN layer formed on the Ta layer.

Various processes may be used to form the conductive layer, such as a CVD process, a PVD process, or an FCVD process, etc. In one embodiment, the conductive layer is formed by a sputtering process.

The thickness of the conductive layer may be smaller than the smallest radius of one of the radius of the first through-holes 208 and the radius of the ring-shaped through-holes 209.

After forming the conductive layer, the electroplating process may be formed to form the metal layer. The metal layer may be on the conductive layer, and may fill the first through-holes 208 and the ring-shaped through-holes 209.

After the electroplating process, a CMP process may be performed to remove portions of the conductive layer and the metal layer on the surface of the insulation layer 207. Thus, the first testing tips 201 and the second testing tips 203 may be formed. The first testing tips 201 and the second testing tips 203 may all include portions of the conductive layer and the portions of the metal layer covered by the portions of the conductive layer. The portions of the conductive layer may be used as a diffusion barrier layer to prevent the metal in the metal layer from diffusing into the dielectric layer 207. The metal layer may be made of any appropriate material, such as Cu, Au, W, or metal alloy, etc.

In one embodiment, the first testing tips 201 and the second testing tips 203 may be formed by the electroplating process simultaneously. Thus, the first testing tips 201 and the second testing tips 203 may not be damaged by etching process. Therefore, the morphology of the first testing tips 201 and the second testing tips 203 may be as desired.

Figure 13:
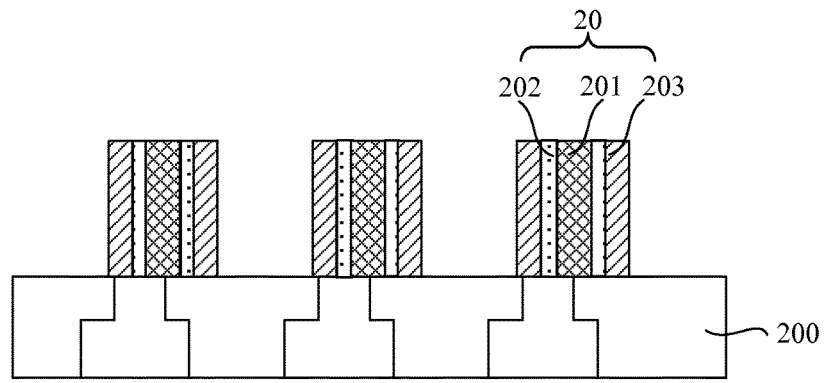

Returning to FIG. 15, after forming the first testing tips 201 and the second testing tips 203, a portion of the dielectric layer 207 outside of the second testing tips 203 may be removed (S203). FIG. 13 illustrates a corresponding structure.

As shown in FIG. 13, a portion of the dielectric layer 207 outside of the second testing tips 203 is removed; and the outer side surfaces of the second testing tips 203 may be exposed. The portion of the dielectric layer between the first testing tip 201 and the corresponding second testing tip 203 may be configured as an insulation layer 202. Thus, a plurality of testing probes 20 may be formed on the surface of the substrate 200. That is, the testing fixture may include the substrate 200 and the plurality of testing probes 20. Further, the disclosed process for forming the testing fixture may also be used for forming one or more of testing probes 20.

Before removing the portion of the dielectric layer 207 outside of the second testing tips 203, a pattered mask layer (not shown) may be formed on the surfaces of the first testing tips 201, the surface of the second testing tips 203, and the surface of the portion of the dielectric layer 207 between the first testing tips 201 and the second testing tips 203. Then, the portions of the dielectric layer 207 outside of the second testing tips 203 may be etched using the patterned mask layer as an etching mask to remove the portions of the dielectric layer 207 outside of the second testing tips 203. After removing the portion of the dielectric layer 207 outside of the second testing tips 203, the patterned mask layer may be removed.

The portions of the dielectric layer 207 outside of the second testing tips 203 may be etched by any appropriate process, such as a dry etching process, or a wet etching process, etc. The patterned mask layer may be removed by any appropriate process, such as a dry etching process, a wet etching process, or a plasma ashing process.

According to the disclosed methods and structures, the testing probe may include first testing tip having a first tip body, a first testing head at one end of the first tip body; and a first connecting end at the other end of the first tip body. The testing probe also includes an insulation layer formed on the side surface of the first tip body. Further, the testing probe may also include a second testing tip being coaxial with the first testing tip and formed around the surface of the insulation layer. That is, the first testing tip and the second testing tip may be integrated in one testing probe. Thus, the mechanical strength of the testing probe may be improved when the size of the testing probe is substantially small.

Further, because the first testing tip and the second testing tip may be coaxially distributed, the distance accuracy between the first testing tip and the second testing tip may be significantly high. Thus, the testing accuracy may be improved.

Further, the first testing tip and the second testing tip may be integrated into a single testing probe. Thus, a single testing probe may be used as stand-alone to perform an electrical testing.

Further, when a plurality of testing probes are formed on a substrate to form a semiconductor testing fixture, a plurality of tested terminals may be tested simultaneously. Thus, the efficiency of the electrical testing may be improved.

Further, a signal-transmitting circuit may be formed in the substrate of the semiconductor testing fixture, it may be convenient to transmit and receive the testing signals. Further, the integration level of the testing fixture may also be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A testing probe, comprising:
   a first testing tip having a first tip body with one end being configured as a first testing head and the other end being configured as a first connecting end;
   an insulation layer formed on a side surface of the first testing tip; and
   a second testing tip having a second tip body with one end being configured as a second testing head leveling with the first testing head and the other end being configured as a second connecting end, the second testing tip being coaxial with the first testing tip and surrounding the first testing tip formed on a side surface of the insulation layer, wherein a first end surface of the insulation layer levels with an end surface of the first testing tip and an end surface of the second testing tip, a second end surface of the insulation layer levels with the first connecting end and the second connecting end, and the first connecting end, the second connecting end and the second end surface of the insulation layer are levelly formed on a substrate.

2. The testing probe according to claim 1, wherein:
   a width of a portion of the second tip body near the second testing head continuously decreases along a direction from the second connecting end to the second testing head.

3. The testing probe according to claim 1, wherein:
   the first testing probe is a cylinder.

4. The testing probe according to claim 3, wherein:
   a diameter of the first testing tip is in a range of approximately 500 nm to 500 μm;
   a width of the insulation layer is in a range of approximately 80 nm to 400 μm; and
   a width of the second testing tip is in a range of approximately 60 nm to 300 μm.

5. The testing probe according to claim 1, wherein:
the insulation layer is made of one of silicon oxide, silicon nitride, silicon oxynitride, silicon carbonitride, and resin.

6. The testing probe according to claim 1, wherein the substrate further comprises:
a testing circuit having a first signal terminal electrically connected with the first connecting end of the first testing tip and a second signal terminal electrically connected with the second connecting end of the second testing tip formed in the substrate.

7. The testing probe according to claim 1, wherein the substrate further comprises:
a signal-transmitting circuit including a first output terminal electrically connected with the first connecting end of the first testing tip, a second output terminal electrically connected with the second connecting end of the second testing tip, and a first input terminal and a second input terminal electrically connected with an external testing circuit.

8. The testing probe according to claim 1, wherein the end surface of the insulation layer levels with the first testing head and the second testing head.

\* \* \* \* \*